United States Patent
Ariel et al.

(10) Patent No.: US 6,671,852 B1
(45) Date of Patent: Dec. 30, 2003

(54) SYNDROME ASSISTED ITERATIVE DECODER FOR TURBO CODES

(75) Inventors: Meir Ariel, Tel Aviv (IL); Ofer Amrani, Tel Aviv (IL); Reuven Meidan, Ramat Hasharon (IL)

(73) Assignee: Motorola, Inc., Schaumburg, IL (US)

( * ) Notice: Subject to any disclaimer, the term of this patent is extended or adjusted under 35 U.S.C. 154(b) by 208 days.

(21) Appl. No.: 09/655,996

(22) Filed: Sep. 6, 2000

(51) Int. Cl.[7] .............................................. H03M 13/00
(52) U.S. Cl. ...................................... 714/793; 714/780
(58) Field of Search ................................. 714/793, 795, 714/792, 791; 375/256, 341, 340

(56) References Cited

U.S. PATENT DOCUMENTS

| | | |
|---|---|---|
| 3,662,338 A | 5/1972 | Cain III |
| 4,354,269 A | 10/1982 | Vries et al. |
| 4,404,674 A | 9/1983 | Rhodes |
| RE31,666 E | 9/1984 | Doi et al. |
| 4,521,886 A | 6/1985 | Dollard et al. |
| 4,998,253 A | 3/1991 | Ohashi et al. |
| 5,381,425 A | 1/1995 | Bitzer et al. |
| 5,682,395 A | 10/1997 | Begin et al. |
| 5,848,106 A * | 12/1998 | Khayrallah .................. 375/340 |
| 5,920,599 A * | 7/1999 | Igarashi ....................... 375/341 |
| 6,088,828 A | 7/2000 | De Bart et al. |
| 6,167,552 A | 12/2000 | Gagnon et al. |

FOREIGN PATENT DOCUMENTS

GB          0625829 A2 *  11/1994  .......... H03M/13/00

OTHER PUBLICATIONS

Ohashi et al., Development of a variable rate syndrome sequential decoder based on a stack algorithm, 1988, IEEE, p. 0131–1035.*

Schalwijk et al., Syndrome decoding of convolutional codes, Jul., –1975, IEEE Trans. on Comm., p. 789–792.*

Bahl et al., Optimal decoding of linear codes for minimizing symbol error rate, Mar.,–1974, IEEE trans. on Info. Theory, p. 284–287.*

Lucas et al., "On Iterative Soft–Decision Decoding of Linear Binary Block Codes and Product Codes", IEEE 1998, col. 2, p. 276.

Hsu et al., "A Soft Decision Syndrome Decoding Algorithm for Convolutional Codes", IEEE 1990, col. 1, p. 375.

Ariel et al., "Soft Syndrome Decoding of Binary Convolutional Codes", IEEE 1995, col. 1, p. 288.

Moeneclaey et al., "Syndrome–Based Viterbi Decoder Node Synchronization and Out–of Lock Detection", IEEE 1990, col. 1, p. 605.

* cited by examiner

*Primary Examiner*—Albert Decady
*Assistant Examiner*—Shelly A Chase
(74) *Attorney, Agent, or Firm*—Randall S. Vaas

(57) ABSTRACT

A syndrome assisted iterative decoder (173) uses iterative processing to decode an input sequence. A syndrome-assisted decoder (216), which may operate independently of a soft-output decoder, provides a stopping algorithm for the soft output decoder (240). When the syndromes $s_0$ and $s_1$ generated for sequence $v_0$ and $v_1$, respectively, both equal 0, the soft output decoder is finished decoding the sequence of data. Additionally, the syndrome-assisted decoder can generate a modified error trellis used by the soft output decoder whereby the soft-output decoder operates on a simplified trellis providing improved decoder performance.

24 Claims, 3 Drawing Sheets

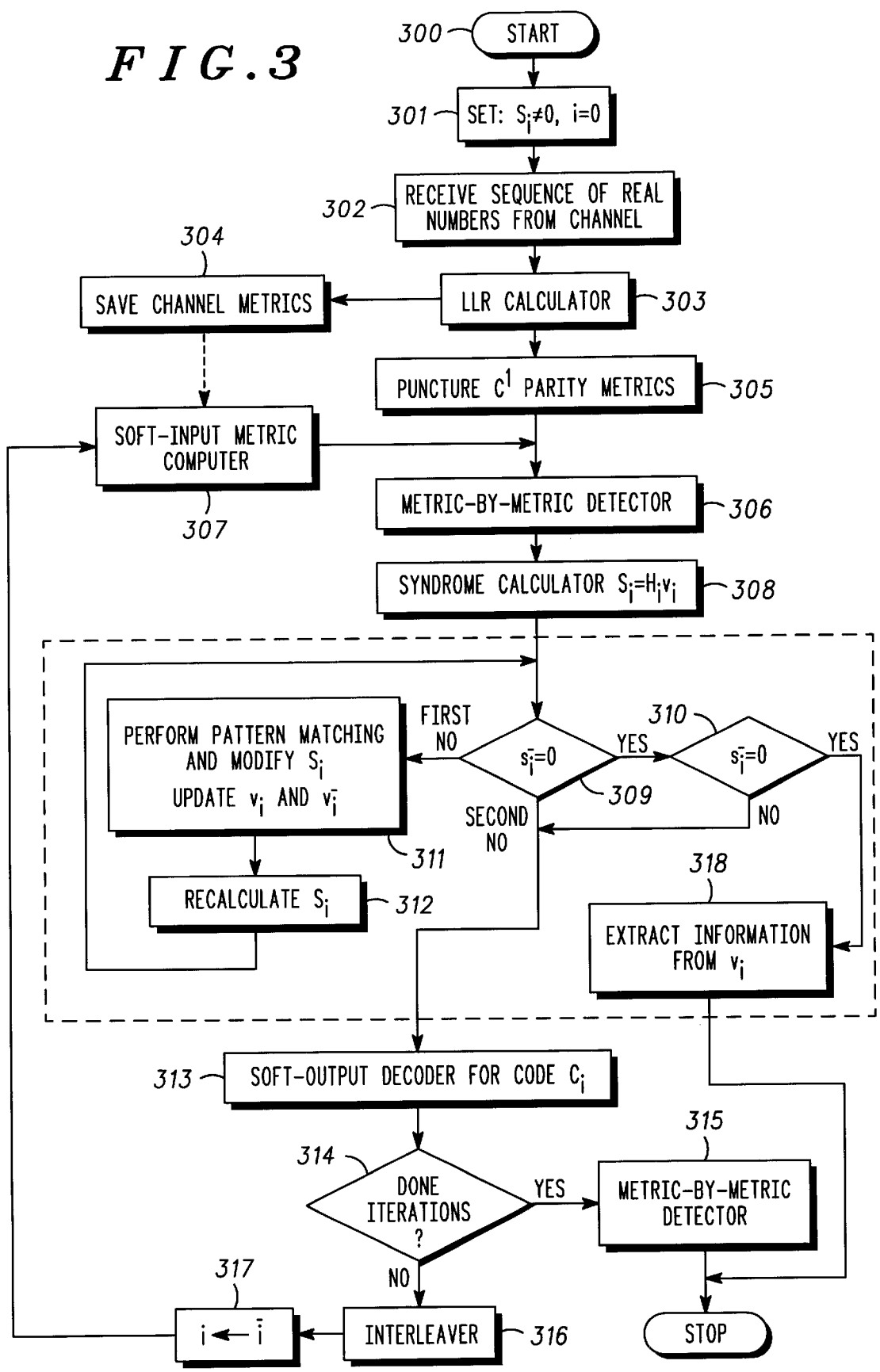

SYNDROME ASSISTED ITERATIVE DECODER FOR TURBO CODES

FIELD OF THE INVENTION

This present invention relates generally to communication systems, and more particularly to a soft-output decoder for use in a receiver of a convolutional code communication system.

BACKGROUND OF THE INVENTION

Convolutional codes are often used in digital communication systems (e.g., the direct sequence code division multiple access (DS-CDMA), IS-95, IS-136, and Global System for Mobile Communications (GSM) standards) to protect transmitted information. At the transmitter, an outgoing code vector may be described using a trellis diagram whose complexity is determined by the constraint length of the encoder. Although computational complexity increases with increasing constraint length, the robustness of the coding also increases with constraint length.

At the receiver, a soft-decision decoder, such as a Viterbi decoder, uses a trellis structure to perform an optimal search for the maximum likelihood transmitted code vector. More recently, turbo codes have been developed that outperform conventional coding techniques. Turbo codes are generally composed of two or more convolutional codes and random interleavers. Turbo decoding is iterative using a soft output decoder to decode the constituent convolutional codes.

The soft output decoder provides a reliability measure on each information bit, which is used to help the soft output decoder of the other convolutional codes. The soft output decoder computes an approximated probability ratio (the log likelihood probability ratio) for each information bit in a received signal. The soft output decoder is usually a type of MAP (maximum a posterior) decoder, which uses both backward and forward decoding to determine the soft output. Due to memory, processing, and numerical tradeoffs, MAP decoding is usually limited to a sub-optimal approximation. All of these variants require both forward and backward decoding over the block.

For future standards, such as the 3GPP (third generation partnership project for wireless systems), an 8-state turbo code with a block length of N=5120, will need 40960 words of intermediate storage, which may be unacceptable for practical implementation. Future systems employing larger frames and a greater number of states will require even more memory. By comparison, a Viterbi decoder that does not produce soft outputs for an N=5120, 8-state trellis requires less than 100 words of intermediate storage.

There is a need for an efficient soft output decoder that reduces overall memory and processing requirements for decoding convolutional codes without the limitations imposed by prior art turbo and MAP decoders.

BRIEF DESCRIPTION OF THE DRAWINGS

FIG. 3 shows a more detailed flow chart of the operation of the soft output decoder including the syndrome calculator, syndrome assisted decoder and soft output decoder shown in FIG. 2.

DETAILED DESCRIPTION OF THE DRAWINGS

A syndrome assisted iterative decoder 173 includes soft output decoding. The syndrome assisted iterative decoder 173 also includes syndrome assisted decoding to support a stopping algorithm for the iterative decoding of the received data. Whereas prior iterative decoders would typically use a predetermined number of iterations regardless of the received signal quality, the present decoder permits dynamic allocation of processing power based upon the quality of the transmission channel. In operation, punctured code sequences $v_0$ and $v_1$ are produced from the received sequence. The sequences are decoded iteratively in a soft output decoder. The syndrome-assisted decoder produces syndromes $s_0$ and $s_1$ for the received hard-decision vectors $v_0$ and $v_1$, respectively. When both syndromes equal 0, the soft output decoder is finished decoding the sequence. The number of iterations for the decoder is thus determined by the amount of distortion caused by the communication channel, which may be wire, cable, fiber optic, air, or the like. Thus a signal received over a clean channel will require fewer iterations than one received over a noisy channel. Additionally, according to one embodiment, the syndrome-assisted decoder can generate a modified error trellis for use by a soft output decoder thereby improving the efficiency of the soft output decoder.

Figure 1:
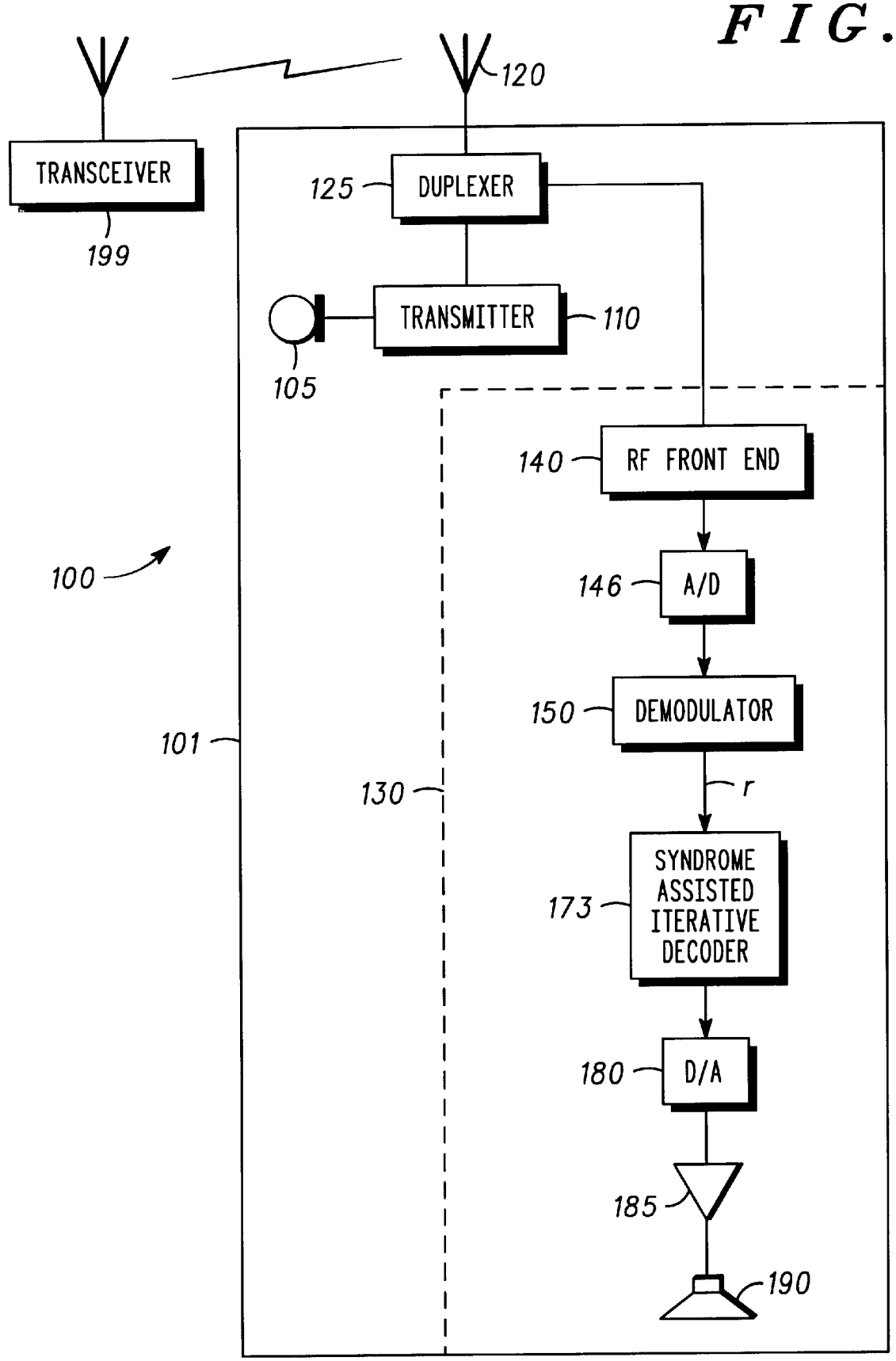
FIG. 1 shows a block diagram of a communication system with a receiver having a soft-decision decoder.

FIG. 1 shows a block diagram of a communication system 100 with a receiver 130 having a syndrome assisted iterative decoder 173. Receiver 130 is shown as part of a cellular radiotelephone subscriber unit 101; however, the receiver may alternately be part of a digital telephone, a facsimile machine, a modulator-demodulator (MODEM), a two-way radio, a base station, or any other communication device that receives convolutionally encoded signals. In the subscriber unit 101, a microphone 105 picks up audio signals that are modulated by a transmitter 110 and broadcast by an antenna 120 after passing through a duplexer 125. The antenna 120 also receives radio frequency (RF) signals from a complementary transmitter in a transceiver 199, which may for example be a cellular base station. A radio frequency (RF) front end 140 steps down the received RF signal received through duplexer 125 to an analog baseband signal. An analog-to-digital (A/D) converter 146 can be connected to the RF front end to convert the analog baseband signal to a digital signal. Those skilled in the art will recognize that the A/D converter 146 may not be required where the baseband signal is digital. Digital demodulator 150 processes the digital signal to produce a demodulated received signal vector r.

The demodulated received signal vector r is connected to a syndrome assisted iterative decoder 173. The syndrome assisted iterative decoder 173 generates an error trellis and identifies when syndromes $s_0$ and $s_1$ for $v_0$ and $v_1$, respectively, are both equal to 0. The syndrome assisted iterative decoder also generates soft output data from input data sequences by iteratively decoding an input sequence. At the output of syndrome assisted iterative decoder 173, a digital-to-analog (D/A) converter 180 converts the maximum likelihood soft-decision decoded signal to the analog domain, and an audio amplifier 185 uses operational amplifiers to increase the gain of the recovered signal for reproduction through audio speaker 190. Those skilled in the art will recognize that the decoder is preferably an approximated a posterior decoder, and that the D/A converter 180 can be omitted where the baseband signal, and thus the output of the receiver 130, is digital.

The syndrome assisted iterative decoder 173 may be implemented using any suitable circuitry, such as a digital signal processor (DSP), a microprocessor, a microcontroller, a combination thereof, or the like. It is envisioned that the syndrome assisted decoder 222 and the soft output decoder 240 can both be embodied in a single integrated circuit (IC) or different ICs. The soft output decoder 240 may decode the trellis constructed by the syndrome assisted decoder to take advantage of the simplified error trellis produced therein, or the soft output decoder 240 may decode the incoming data without using the error trellis produced by the syndrome assisted decoder. In the later case, the error trellis composed by the syndrome-assisted decoder will only be used to identify the point when the soft output decoder iterations may stop.

Figure 2:
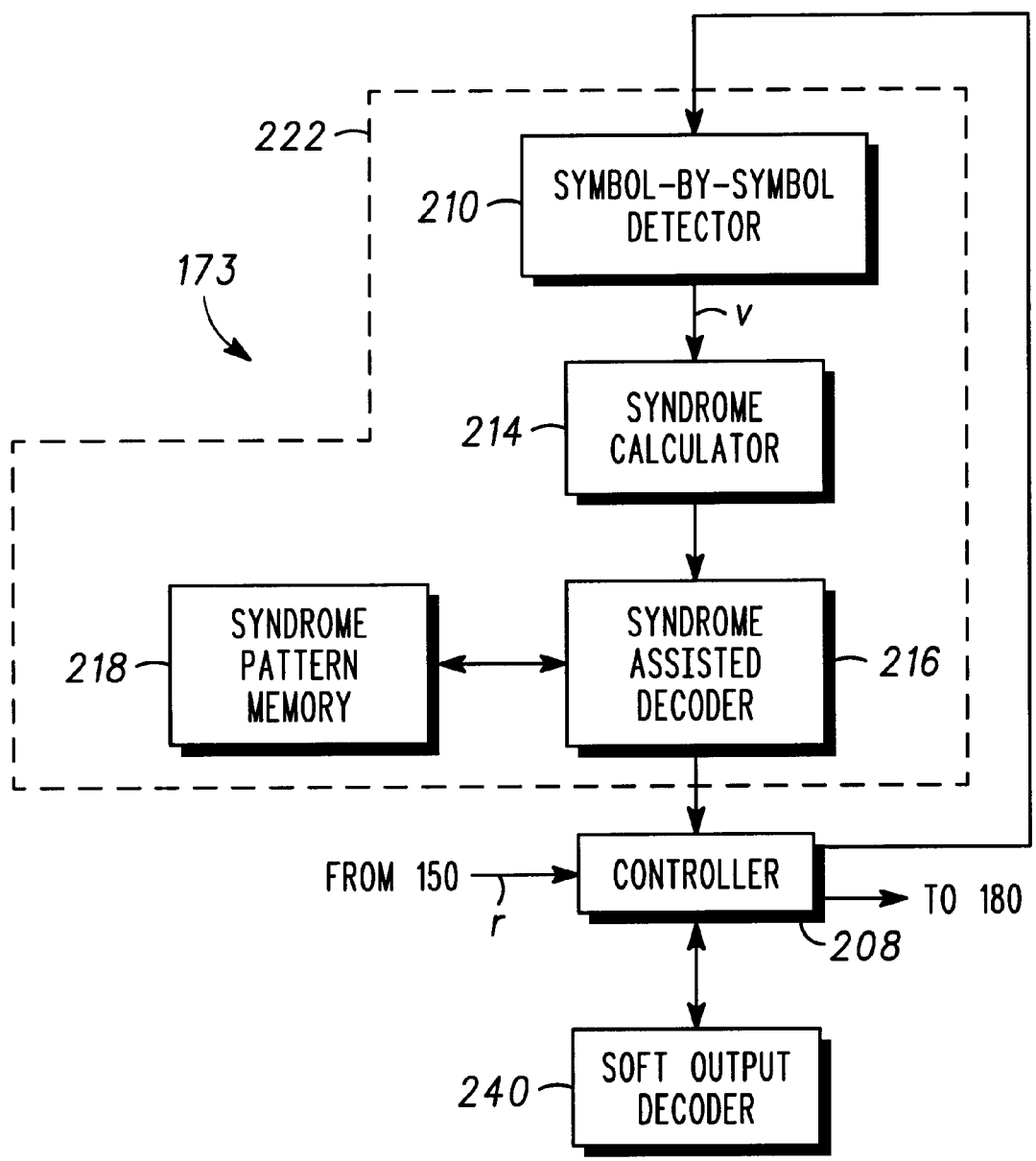
FIG. 2 shows a block diagram of the trellis composer and optimum state detector shown in FIG. 1.

FIG. 2 shows a block diagram of the syndrome assisted iterative decoder 173 of FIG. 1 in greater detail. The controller 208 receives as inputs the demodulated received signal vector r, the output of the soft output decoder 240 and the output of the syndrome-assisted decoder 222. The controller initially inputs the signal vector r to the symbol-by-symbol detector 210 that produces hard-decision vector v therefrom. The symbol-by-symbol detector merely examines the incoming signal and converts it to the closest valid (e.g., binary) symbol without regard for the value of the surrounding symbols. The symbol-by-symbol detector may be a hard comparator, which compares the input signal level to a threshold and outputs a logic one or a logic zero depending upon whether the input signal is above or below the threshold. The output hard-decision vector v of a symbol-by-symbol detector 210 is not necessarily a valid code vector. The vector v includes $v_0$ and $v_1$ that comprise parity bits $Y_k^0$ or $Y_k^1$, respectively, and data bits $d_k$. A syndrome calculator 214 multiplies the hard-decision vectors $v_0$ and $v_1$ by scalar parity check matrix H to produce syndrome vectors $s_0$ and $s_1$. In the situation where syndrome vectors $s_0$ and $s_1$ equal 0, then hard-decision vectors $v_0$ and $v_1$ are the maximum likelihood estimated transmitted code vector C, and it is guaranteed that hard-decision vector v is identical to the output of a soft-decision decoder such as a Viterbi decoder, and no additional processing will be required.

If syndrome vector s≠0, which is often the case prior to removal of syndrome patterns, the syndrome assistant decoder (SAD) 216 performs a search through the computed syndrome vector to detect predetermined syndrome patterns stored in syndrome pattern memory 218, which stored patterns correspond to specific error patterns $e_p$, such as single-error syndrome patterns or double-error syndrome patterns, in the received hard-decision vector v. The DAD first operates on $v_0$, although it applies the identified syndrome patterns in $s_0$ to $v_1$ by modifying $s_1$. If a syndrome pattern, p, is discovered in the syndrome vector $s_0$, SAD 216 simplifies the syndrome vector $s_0$ by subtracting the syndrome pattern p and records the found error pattern $e_p$ in an estimated error vector ë according to the search results. The modified syndrome vector $s_0'$ is simplified in the sense that it has more zeros than the original syndrome vector $s_0$. If $s_0'=0$, then ê=ë is the most likely transmission error vector, and the maximum likelihood estimated transmitted code vector is ç=v−ê. If modified syndrome vector $s_0'=H(v-ë)≠0$ after subtracting a found syndrome pattern p, the SAD 216 continues to search for syndrome patterns until all of the syndrome patterns in the syndrome pattern memory 218 have been compared with the modified syndrome vector $s_0'$ or until the modified syndrome vector $s_0'=0$. The syndrome vector $s_1'$ is also formed by applying to $s_1$ all the modifications made to syndrome vector $s_0$ in creating $s_0'$.

After all of the syndrome patterns in the syndrome pattern memory 218 have been applied to $v_0$ and $v_1$ to create the modified syndrome $s_0'$ and $s_1'$, and if at least one of the modified syndromes is not 0, the controller 208 sends the obtained simplified error trellis is to be utilized by the soft output decoder 240.

The search for the most likely transmission error vector ê that produces the syndrome vectors $s_0'$ and $s_1'$ can be described by a search through an error trellis diagram for the path with the minimum accumulated weight. Meir Ariel and Jakov Snyders, provide an in-depth discussion and detailed examples of how to construct and decode an error trellis in an article entitled "Soft Syndrome Decoding of Binary Convolutional Codes," published in Vol. 43 of the IEEE Transactions on Communications, pages 288–297 (1995), the disclosure of which is incorporated herein by reference thereto. An error trellis that describes the same coset of the convolutional code to which the symbol-by-symbol vector v belongs is used to search for the most likely transmitted data sequence. The shape of the error trellis depends only on the value of the computed syndrome vector, and a modified syndrome vector produces a simplified error trellis. Once the error trellis is constructed, an accelerated search through a simplified error trellis is possible due to its irregular structure. Under low bit-error rate conditions, the error trellis can be substantially simplified without affecting the optimum output of the decoding procedure. In other words, the SAD 216 simplifies the syndrome vector to promote long strings of zeros, which allows the construction of an error trellis which can be used for processing by the soft output decoder making the soft output decoder more efficient.

A general description of the soft output decoder 240 will now be provided. Turbo codes are constructed as a concatenation of two recursive systematic convolutional codes $C_0$ and $C_1$ linked together by some non-uniform interleaving. Although convolutional in nature, turbo codes cannot be decoded directly using a Viterbi decoder since their corresponding trellis diagram has in general a huge number of states. Therefore, an iterative approach is employed with two elementary decoders, each associated with a respective one of the two constituent codes. The two decoders are usually serially concatenated, where the first decoder yields weighted, or soft output, decisions, based upon reliabilities, which outputs are fed to the second decoder as a priori information. The soft outputs of the second decoder are then fed back to the first decoder for the second iteration, and so on. Only the extrinsic information, which is the new information that is generated by a decoder, is passed between the decoders.

There are several known methods for obtaining soft-output reliability measures, from the most complex, yet optimal, MAP algorithm to the reduced complexity MAX-Log-MAP algorithm and the Soft Output Viterbi Algorithm (SOVA). A novel soft output error trellis decoder for convolutional codes is disclosed in U.S. Pat. No. 09/655,995, entitled "Soft-Output Error-Trellis Decoder for Convolutional Codes" and filed by Ariel et al., the disclosure of which is incorporated herein by reference thereto. A novel method for identifying a window and an optimum state for a soft output decoder is disclosed in U.S. Pat. No. 6,452,979 entitled "Soft-Output Decoder for Convolutional Codes" and filed by Ariel et al., the disclosure of which is incorporated herein by reference thereto.

The soft output decoder 240 can use a trellis generated by the SAD 216 to generate the decoded sequence output to D/A converter 180 by controller 208. Those skilled in the art will recognize that the decoder can include a syndrome modifier and any suitable decoder, preferably a soft output decoder. Most of the soft input soft output (SISO) decoders employed for turbo codes are based on the MAP algorithm described in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (the "BCJR algorithm" or "BCJR method"), the disclosure of which is incorporated herein by reference thereto. As will also recognized by those skilled in the art, turbo coders are constructed with interleavers and constituent codes, which are usually recursive systematic convolutional codes, but can alternately be block codes. MAP algorithms not only minimize the probability of error for an information bit given the received sequence, they also provide the probability that the information bit is either a 1 or 0 given the received sequence.

A MAP decoder is optimal in the sense that it minimizes the probability of symbol error. It is, however, too complex to implement in practice. Several approximations of the MAP decoder have been proposed, including the Soft-Output Viterbi Algorithm (SOVA), the Log-MAP, and the Max-Log-MAP algorithms. All of these algorithms perform in the logarithmic domain, whereby computational complexity is reduced.

The BCJR algorithm provides a soft output decision for each bit position (stage) wherein the influences of the soft inputs within the block are broken into contributions from the past (earlier soft inputs), the present soft input, and the future (later soft inputs). This decoding algorithm requires a forward and a backward generalized Viterbi recursion on the trellis to arrive at an optimum soft output for each trellis location, or stage. These a posteriori probabilities, or more commonly the log-likelihood ratios (LLR) of the probabilities, are passed between SISO decoding steps in iterative turbo decoding. The LLR for information bit $u_t$ is:

$$\Lambda_t = \log \frac{\sum_{(m,n) \in B^1} \alpha_{t-1}(n) \gamma_t(n, m) \beta_t(m)}{\sum_{(m,n) \in B^0} \alpha_{t-1}(n) \gamma_t(n, m) \beta_t(m)}, \quad (1)$$

for all bits in the decoded sequence (t=1 to N). In equation (1), the probability that the decoded bit is equal to 1 (or 0) in the trellis given the received sequence is composed of a product of terms due to the Markov property of the code. The Markov property states that the past and the future are independent given the present. The present, $y_t(n,m)$, is the probability of being in state m at time t and generating the symbol $y_t$ when the previous state at time t-1 was n. The present operates as a branch metric. The past, $\alpha_t(m)$, is the probability of being in state m at time t with the received sequence $\{y_1, \ldots, y_t\}$, and the future, $\beta_t(m)$, is probability of generating the received sequence $\{y_{t+1}, \ldots y_N\}$ from state m at time t. The probability $\alpha_t(m)$ can be expressed as function of $\alpha_{t-1}(m)$ and $y_t(n,m)$ and is called the forward recursion $$\alpha_t(m) = \sum_{n=0}^{M-1} \alpha_{t-1}(n) \gamma_t(n, m), m = 0, \ldots, M-1, \quad (2)$$

where M is the number of states. The reverse or backward recursion for computing the probability $\beta_t(n)$ from $\beta_{t+1}(n)$ and $y_t(n,m)$ is $$\beta_t(n) = \sum_{m=0}^{M-1} \beta_{t-1}(m) \gamma_t(n, m), n = 0, \ldots, M-1. \quad (3)$$

The overall a posteriori probabilities in equation (1) are computed by summing over the branches in the trellis $B^1$ ($B^0$) that correspond to $u_t=1$ (or 0).

Maximum a posteriori (MAP) type decoders (MAP, log-MAP, max-log-MAP, constant-log-MAP, SOVA, etc.) utilize forward and backward generalized Viterbi recursions on the trellis in order to provide soft outputs, as is known in the art. The MAP decoder minimizes the decoded bit error probability for each information bit based on all received bits. However, typical prior art MAP decoders require a large memory to support full block decoding.

Regardless of what type of soft output decoder is used, soft outputs are generated over multiple iterations. It is generally assumed that as the number of iterations increases, the reliability of the soft-output information improves, increasing the probability of accurate decoding the data sequence output by the decoder. The first few iterations however attain most of the improvement, with decreasing relative improvement as more iterations are performed. This essentially means that the probability of correct decoding could be relatively high even after a small number of iterations. Although the iterative process can be terminated when the soft outputs have reached a certain desirable reliability level, prior iterative decoders typically operate over a fixed number of iterations regardless of the quality of the received signal. A method for determining when a reliable level has been reached will be useful in reducing the average number of iterations, and hence the decoding complexity and delay.

The operation of the present method for detecting when to stop iterative decoding will be described with respect to FIG. 3. An iterative method for decoding concatenated convolutional codes (such as turbo codes) is employed. A syndrome-assisted decoder (SAD) is used as a preprocessing stage prior to the soft output decoder for each of the two constituent codes. In the preprocessing stage, predetermined likely error patterns are corrected, and a stopping algorithm based on maximum likelihood criterion is applied. The preprocessing stage is aimed at reducing the complexity involved in each iteration, as well as the average number of iterations, without compromising the bit error rate performance.

More particularly, the transmitted code sequence is given by $\{c_k\}$, with $c_k=(Y_k, Y_k^0, Y_k^1)$, where $X_k=d_k$ is the information bit at time k, $Y_k^0$ is the parity output from the encoder $C_0$, and $Y_k^1$ is the parity output from the encoder $C_1$. The received sequence is denoted by $\{R_k\}$, where $R_k=(x_k, y_k^0, y_k^1)$ is the received (noisy) version of the transmitted symbol $c_k=(X_k, Y_k^0, Y_k^1)$. The received sequences $v_0$ and $v_1$ are the punctured received sequences $X_k, Y_k^0$ and $X_k, Y_k^1$, respectively. Initially, $s_1 = 0$ and i=0, which are set in step 301. From the received sequence input in step 302, a priori channel information, which is log likelihood ratio (LLR) information $LLR(x_k, y_k^0, y_k^1)$, is calculated in step 303 and stored in step 304, for use in the iterative process. The metrics associated with the parity check bits of the code $C_1$ are then punctured in step 305, leaving metrics associated with the parity check bits of the code $C_0$. Metric-by-metric hard detection is performed in step 306 on the punctured sequence $\{LLR(x_k, y_k^0)\}$ of LLRs. The detection in step 306 is performed by converting input real numbers into a 1 or a 0 based on whether the input number is above or below a threshold level. The threshold level can be set equal to 0. In all the subsequent iterations, metric-by-metric hard detection will be performed on the soft metric computed in step 313. The obtained hard-detection vector, denoted $v_0$, is then employed for computing the syndromes $s_0=H_0 v_0^t$ in step 308, associated with the code $C_0$, where $H_0$ is the parity-check matrix of the code $C_0$.

Based on the obtained syndrome, a Syndrome Assisted Decoder (SAD) algorithm is performed. The SAD aims at accelerating the iterative decoding procedure by reducing the number of iterations required for obtaining a desirable bit error rate. Furthermore, the SAD provides a stopping criteria for terminating the iterative process based on maximum likelihood considerations. This stopping criteria requires that both syndromes $s_0$ and $s_1$, associated with the hard-detected sequences $v_0$ and $v_1$, respectively, are equal to zero simultaneously. Since the SAD operates independent of the soft-output decoder, it may be employed in one of two ways. The first way is to use the stopping algorithm where the soft input metrics to the soft output decoder 240 are not modified by the SAD, thus not affecting the performance of the MAP type decoder. In this case, soft output decoding will continue until $s_0=s_1=0$ as detected in the soft output decoder. Alternatively, the SAD may be used both as a stopping algorithm and as a pre-processing decoding step aimed at expediting the iterative decoding procedure. In this alternative case, the syndrome corrected data will be used to send more reliable input to the soft output decoder.

The SAD can operate as follows. If $s_0=s_1=0$, as determined in steps 309 and 310, for both $v_0$ and $v_1$ (the hard decision codes corresponding to code words $C_0$ and $C_1$), then the process proceeds to step 318. In step 318 the received data is extracted directly from the vector $v_1$. If $s_0 \neq 0$, as determined in step 309 the first time, then pattern matching is applied to $s_0$ by using memory 218 in an attempt to identify and correct the most likely errors in $v_0$, and modify the syndrome $s_0$ accordingly, as indicated in step 311. The vector $v_1$ is then updated in step 311 by applying the syndromes identified in pattern matching step 311 to $s_1$. If the SAD is used both as a stopping algorithm and as a pre-processing decoding step, soft input metrics of the soft output decoder are also modified in step 312. The soft input metrics are modified to reflect the fact that certain information bits have been determined upon by the SAD. Alternatively, it the "Soft-Output Error-Trellis Decoder for Convolutional Codes" disclosed in U.S. Pat. No. 6.452,979 is employed, then the SAD generates a modified error trellis for use by a soft output decoder thereby improving the efficiency of this soft output decoder.

Based upon the updated vector $v_1$ identified in step 311, the syndrome $s_1$ is recalculated in step 312. The modified syndrome is checked again in steps 309 and 310. If $s_0=0$ as determined in step 309, and $s_1=0$ as determined in step 310, then the processor proceeds to step 318 wherein the received data is extracted directly from $v_i$. In step 318, the syndrome assisted iterative decoder extracts the information bits from $v_0$ and terminates the iterative decoding process. When the SAD algorithm terminates at step 309 responsive to a second "No" result, soft-output decoding is applied to the code $C_0$ as indicated in step 313. The soft output operates on the previous iteration's soft output values except during the first iteration. The decoder determines if additional iterations are required in step 314. Step 314 detects when a maximum number of permissible iterations have been performed. Step 314 determines that no additional iterations are required if an arbitrarily determined maximum number of iterations have occurred, which may for example be in the range of 4 to 16 iterations depending upon the application. An iteration is one cycle through steps 306 through 313 for both $C_1$ and $C_0$. In step 315 a metric-by-metric detector outputs the final hard decisions based on the soft-outputs obtained from decoding in step 313. The metric-by-metric detector outputs a logic 0 or a logic 1 depending upon whether a bit is above or below a threshold level. If additional iterations are required, because the maximum number of iterations have not been executed as determined in step 314, then the soft-output metrics are appropriately interleaved in step 316 (in the same manner as in the encoder in transceiver 199). In step 307, soft-input metrics associated with the code $C_1$ are computed using the extrinsic information computed in step 313 and the channel measurements $LLR(x_k, y_k^1)$ saved in step 304. The same process of steps 306-313 repeats for $v_1$ as described above with respect to $v_0$. Steps 316, 317, and 307 thus represent steps for switching between $C_0$ and $C_1$ so that each is considered for each iteration.

After each iteration, the updated metrics associated with codes $C_0$ and $C_1$ generated by the soft output decoder step 313 are stored for the next iteration. The previous iteration's metrics generated in step 313 are thus used for the current iteration. Once $s_1$ and $s_0$ are both equal to 0 (as detected in steps 309 and 310), or the maximum permitted number of iterations have taken place (as determined in step 314), the decoder will process a new sequence of data starting at step 300. In this manner, the soft output syndrome assisted decoder 173 decodes windows of a full frame sequence. It is envisioned that the windows will be smaller than 100 stages (bits), and may for example be 30 to 60 stages long, and the full block may be thousands of stages (bits) long.

In this manner an efficient soft output decoder is provided. The syndrome-assisted iterative decoder reliably determines when the soft output decoder can stop iterative decoding. In this manner, data subject to no or small disturbances will be decoded effectively with no or few iterations and data subject to many disturbances will be decoded with ample iterations. The number of iterations being dynamically adjusted for the current channel conditions.

We claim:

1. A syndrome assisted iterative decoder comprising:
   a syndrome assisted decoder to generate a first syndrome and a second syndrome for an input data sequence and to detect when a predetermined condition is met; and
   a soft output decoder coupled to the syndrome assisted decoder, the soft output decoder to iteratively decode the input data sequence, outputs of the soft output decoder at iterations being provided to the syndrome assisted decoder to generate modified syndromes, and stopping the iterative decoding for the input data sequence when the syndrome assisted decoder detects a predetermined syndrome condition.

2. A decoder according to claim 1 wherein syndrome assisted decoder detects when the first syndrome and second syndromes associated with a first set and a second set of channel metrics each meet the predetermined condition.

3. A decoder according to claim 1, wherein the soft output decoder detects when the first and second syndromes are equal.

4. A decoder according to claim 3, wherein the soft output decoder detects when the first and second syndromes each equal 0.

5. A decoder according to claim 3, wherein the soft output decoder modifies its soft metrics using an error trellis produced by the syndrome-assisted decoder.

6. A decoder according to claim 5, wherein the soft output decoder employs the error trellis in decoding the received sequence.

7. A decoder according to claim 6 wherein a syndrome corrected input data is used for the input data to the soft output decoder.

8. A radiotelephone having a soft-decision decoder comprising:
   a hard-decision detector, for computing a hard-decision vector from a demodulated received signal vector;
   a syndrome calculator, coupled to the hard-decision detector, for computing a syndrome vector from the hard-decision vector and a parity check matrix;
   a syndrome assisted decoder including a syndrome pattern memory for storing a syndrome pattern, and
   a syndrome modifier, coupled to the syndrome calculator and the syndrome pattern memory, for locating and removing the syndrome pattern from the syndrome to create a modified syndrome;
   and a soft output decoder coupled to the syndrome assisted decoder, the syndrome assisted decoder iteratively decoding the received sequence until the syndrome assisted decoder detects that the syndromes meet a predetermined criteria.

9. A decoder according to claim 8 wherein syndrome based decoder detects when a first syndrome and a second syndrome associated with a first set of channel metrics and a second set of channel metrics meet the predetermined criteria.

10. A decoder according to claim 9, wherein the soft output decoder detects when the first and second syndromes are equal.

11. A decoder according to claim 10, wherein the soft output decoder detects when the first and second syndromes equal 0.

12. A method of soft output decoding a demodulated received signal comprising the steps of:
   decoding the received sequence in a syndrome assisted decoder to identify respective syndromes;
   iteratively decoding the received sequence in a soft output decoder, and providing an output of the soft output decoder to the syndrome assisted decoder;
   generating modified syndromes; and
   stopping iterative decoding when at least one of the syndromes and the modified syndromes associated with respective codes meet a predetermined criteria.

13. The method of claim 12 wherein the step of decoding in syndrome-assisted decoder includes the step of performing pattern matching and updating vectors for each of the codes.

14. The method of claim 13 wherein the step of stopping iterative decoding further includes the step of determining if a maximum number of iterations has been reached.

15. The method of claim 14 wherein the determining if a predetermined criteria has been met includes determining if one or more of the syndromes meets the predetermined criteria.

16. The method of claim 14 wherein the step of determining includes determining if the one or more syndrome is equal to 0.

17. The method according to claim 12 wherein the step of determining determines if both syndromes are equal to 0.

18. The method according to claim 12 wherein the step of decoding includes:
   performing backward recursion decoding to generate backward recursion state metrics;
   performing forward recursion decoding to generate forward recursion state metrics; and
   generating soft outputs as a function of the forward recursion state metrics and the backward recursion state metrics.

19. The method according to claim 18 wherein the step of generating soft outputs uses an error trellis generated by the syndrome assisted decoder.

20. The method according to claim 12 further including the step of extracting the received data from a vector generated using the first and second syndromes.

21. The method according to claim 12 further including the step of determining if a predetermined maximum number of iterations have been performed, and if the predetermined maximum number of iterations have been performed, stopping iterative decoding.

22. The method according to claim 12 further including the step of selectively outputting a decoded data sequence from at least one of the soft output decoding and the syndrome assisted decoding.

23. The method according to claim 22 further including the step of outputting a decoded data sequence from the syndrome assisted decoder when syndromes meet the predetermined condition and outputting a data sequence from the soft output decoder if a predetermined number of iterations occur without the modified syndromes meeting the predetermined condition.

24. The method according to claim 23 wherein the predetermined condition is met when the syndromes equal 0.

* * * * *